United States Patent [19]

Gauje

[11] 4,427,720
[45] Jan. 24, 1984

[54] VAPOR PHASE PROCESS FOR THE DEPOSITION OF A PROTECTIVE METAL COATING ON A METALLIC PIECE

[75] Inventor: Georges M. C. A. Gauje, Saulx les Chartreux, France

[73] Assignee: Societe Nationale d'Etude et de Construction de Moteurs d'Aviation "S.N.E.C.M.A.", France

[21] Appl. No.: 387,481

[22] Filed: Jun. 11, 1982

[30] Foreign Application Priority Data

Jun. 18, 1981 [FR] France .................................. 81 11988

[51] Int. Cl.³ .............................................. C03C 13/02
[52] U.S. Cl. ...................................... 427/237; 427/253
[58] Field of Search ................................. 427/237, 253

[56] References Cited

U.S. PATENT DOCUMENTS 3,286,684 11/1966 Aves ........................................ 18/48

FOREIGN PATENT DOCUMENTS 1142013 of 0000 France .
1433497 of 0000 France .
2134220 of 0000 France .
2181512 of 0000 France .
2303089 10/1976 France .
2378873 8/1978 France .
827132 2/1960 United Kingdom .

Primary Examiner—James R. Hoffman
Attorney, Agent, or Firm—Bacon & Thomas

[57] ABSTRACT

The present invention concerns a vapor phase process for the deposition of at least one protective metal coating on a metal piece. The coating is aluminum, chromium, titanium, or a derivative of these metals or alloys or mixtures. The coating is effected by the reaction of the surface of the metal piece, suitably heated in an enclosure, with a halide compound of the coating metal which is formed by the reaction, in the enclosure, between a chemical halide compound with a donor. The donor consists of the coating metal or an alloy formed in a thin sheet, the surface area being of the same order of magnitude as that of the piece to be coated, located so that the surface area faces the metal piece.

4 Claims, 4 Drawing Figures

VAPOR PHASE PROCESS FOR THE DEPOSITION OF A PROTECTIVE METAL COATING ON A METALLIC PIECE

BACKGROUND OF THE INVENTION

The present invention concerns a vapor phase process for the deposition of a protective coating on a metallic piece, the apparatus for carrying out the process, and the pieces obtained by said process.

A process for the protection of metal pieces, in particular refractory alloy pieces, at elevated temperatures, with a high resistance to deformation by mechanically and thermally generated stresses, by coating the surfaces of said pieces with a suitable metal, has already been described by French Pat. No. 1,433,497. This process consists of contacting said metal pieces, located in a suitably heated enclosure, with a halide of the metal to be deposited; said halide, gaseous at the temperature of said enclosure, being formed by the reaction at an elevated temperature of a chemical halide compound with a derivative (metal or alloy or chemical product) of the metal to be deposited.

Modes of application of this general method have been described in particular in French Pat. Nos. 2,134,220 and 2,181,512 for titanium carbide, nitride or carbonitride coatings.

In the basic French Pat. No. 1,433,497 and in the modes of application described in the U.S. Pat. Nos. 2,134,220 and 2,181,512, the "donor", i.e., the metal derivative to be deposited, are used in the form of particles, i.e., of more or less coarse grains, which are placed advantageously in baskets located in the heated enclosure wherein the coating is effected.

It has now been discovered that the form wherein the donor is used may have a certain influence not merely on the facilities to effect the process, as described, but also on the results that may be obtained.

SUMMARY OF THE INVENTION

It has been discovered, and this is the object of the present invention, that in the process described in the patents referred to, it is highly advantageous to use the donor in the form of a sheet, i.e., a thin object of the metal or an alloy of the metal to be deposited, with the surface area of said metal being of the same order of magnitude as that of the piece (or assembly of pieces) to be coated, the latter facing said sheet.

The sheet used according to the invention must be thin in order to exhibit a relatively low thermal inertia and to reduce as much as possible the time required to establish thermal equilibrium of all of the elements present in the enclosure.

The sheet used must have a surface area of the same order of magnitude as the portion of the surface of the piece to be coated and facing said sheet. In this manner, the donor metal is capable of generating rather rapidly a sufficient quantity of halide to ensure the rapid coating of the entire surface of the piece to be coated and furthermore, the amount of the halide formed is essentially the same at all points of space located in the proximity of the surface to be coated. This latter property is particularly important when the pieces to be coated have complex and convoluted configurations, as the shape of the "donor sheet" may be adapted to the local shape of the piece or assembly of pieces, to be coated.

A further advantage of the use of a donor in the form of a sheet is to eliminate the various phenomena of adhesion which emerge if the donor is used in the form of grains.

DESCRIPTION OF THE DRAWINGS

Examples of the forms of sheets that may be used according to the invention are shown schematically in FIGS. 1, 2, 3 and 4.

DESCRIPTION OF THE PREFERRED EMBODIMENT

Figures 1, 2:
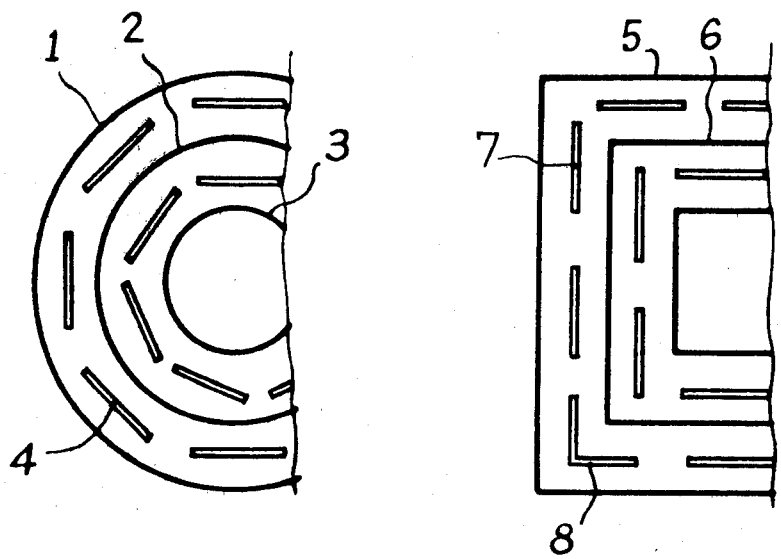

FIG. 1 shows in transverse cross section, the internal arrangement of an enclosure. In this figure, there are represented in a simple manner at (1), (2) and (3), three sheets of an alloy high in aluminum with a thickness of approximately 1.5 mm, forming three concentric cylinders. Between these sheets, the pieces (4) to be coated are placed; they are suspended and have their largest surface area placed advantageously to face two of said sheets. Obviously, the invention is not limited to the use of three sheets placed concentrically; it is equally possible to employ either two sheets defining a single space, or in a more general manner, n number of sheets defining n−1 spaces, wherein the pieces to be treated are introduced.

FIG. 2 shows, again in transverse cross section, another arrangement of sheets (5), (6) and the pieces (7) and (8); it should be noted that the piece (8) to be coated is in a form rather closely resembling the sheets.

Figure 3:
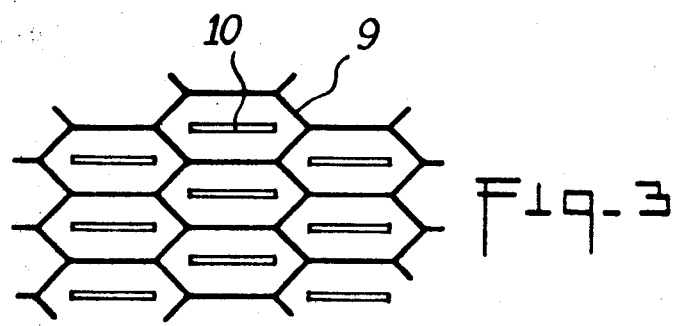

FIG. 3 is another transverse cross section on a portion of the inside of the enclosure, wherein the sheets (9) of the donor material have a honeycomb configuration and enclose the pieces (10) to be coated.

Figure 4:
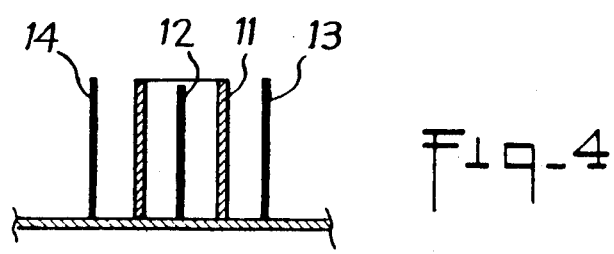

FIG. 4 shows, in transverse cross section, another embodiment of the invention, applicable for example to the inside and outside coating of a blade, said blade, schematically shown at 11, being placed around a donor plate 12 and its external face facing the suitably placed plates 13–14.

As may be seen from the different embodiments of the invention, the pieces to be coated are placed in a coating enclosure so as to face a sheet of the donor of the metallic element which is to enrich the surface of the pieces. A small amount of a halide salt, fluoride or chloride, is added to the charge; the enclosure, covered by its lid, is placed in a furnace with a controlled atmosphere that may be neutral or reducing; and the assembly is heated in keeping with a thermal cycle that is a function of the thickness of the deposit to be effected; of the nature of the alloy to be coated; and of the mechanical properties to be obtained.

The sheet constituting the donor of the element intended to enrich the surface of the pieces is attacked by the halogen generated by the decomposition of the halide salt, thereby producing a halide of the element under consideration, which in turn decomposes in contact with the surface of the pieces placed to face the sheet acting as the donor, without being in contact with it, and the element deposited on the surface of the pieces forms thereon a new alloy with the alloy of which the pieces consist, by diffusing into said pieces at the temperature to which they are heated.

The halogen released by the decomposition of the halide in contact with the pieces again attacks the "donor" sheet and the transport process to the surface of the pieces takes place continuously.

The donor used may be a simple alloy rich in aluminum, if it is desired to obtain a superficial enrichment of the piece treated by this element.

According to the present invention, the "donor" sheet of an alloy high in aluminum may be replaced by a sheet of a different alloy, for example, a chromium-nickel alloy in order, in this case, to transfer chromium from this new source to the surface of pieces placed to face it, with the nickel not being transferred by virtue of the much higher partial pressure of the chromium halide.

In this case, a surface enriched in chromium is obtained and this element is known to appreciably increase the resistance of pieces to corrosion. This operation is known by the general designation of "chromizing", which in the case of the present invention is effected strictly in the "vapor phase" without solid contact between the "source" (the donor) and the pieces to be protected.

Here again, the process has the obvious advantages of simplicity, the non-adherence of different products to the pieces, the limitation to a strict minimum of the "source", resulting in economical heating and of maximum flexibility of the thermal cycles.

According to the present invention, a sheet of titanium of commercial purity, Type T. 40, may further be selected as the source, for example, it is placed to face the pieces to be enriched on the surface in titanium, the assembly being introduced in a coating enclosure as before, in the presence of a halide salt, thereby obtaining on the surface of said pieces a layer of an alloy high in titanium, with the specific properties of such an alloy.

The non-limiting example hereinafter will serve to illustrate the invention.

EXAMPLE 1

In a vessel made of a heat resistant alloy, the following elements are placed: in the center, a bar of an alloy to be coated used to manufacture vanes of aircraft turbojet engine, known under the commercial designation IN 100, having the following composition by weight: Nickel: base, cobalt: 15%, chromium: 10%, aluminum: 5.5%, titanium: 4.5%.

Around this vertically placed bar, sheets consisting of an iron-aluminum alloys with 25% by weight aluminum, together with a small amount of anhydrous ammonium fluoride in the powder form, are arranged. The enclosure is closed by a cover that is not tight and placed in a furnace under an argon atmosphere. After purging the air from the enclosure and the furnace in a convenient manner and replacing it with argon, the heat treatment of the enclosure is effected by continuing it at 1 150° C. for 3 h, followed by a relatively rapid cooling process. After removal from the furnace, the bar has a slightly bluish color.

The rapid rise in temperature, followed by an equally rapid cooling, in the course of the experiment, has been noted in comparison with the solution which consists of using an aluminum donor source in the form of a "pack" or consisting of granules in metal baskets. This highly important result is due to the low thermal inertia of the sheet, or a thin aluminum foil, used as the "source". Its simplicity of employment with respect to the older solutions is evident, and the space saved, especially by the elimination of the baskets, may be used to increase the number of bars or pieces to be treated.

EXAMPLE 2

In this example, the homogeneity of the deposition obtained over the entire volume of the enclosure already used in the preceding example, is verified, by replacing the bar by a certain number of small specimens of a known mass, regularly distributed over the useful space of the enclosure, at a practically constant distance from the sheet of the Fe-Al alloys, serving as the source. Following an identical treatment cycle, a very similar gain in moss was observed for all of the specimens, with this gain in mass being related in preliminary experiments to the thickness of the deposit. This example thus demonstrates the precision in deposition that may be attained by the use of a "source", the position whereof is well defined with respect to the pieces to be coated.

EXAMPLE 3

The use of thin elements with large surface areas is capable of simplifying from the beginning the production task, compared with sources present in the form of granules by eliminating the need for reconditioning them after each treatment cycle. It was necessary to remove the granules from the furnace, screen them to verify their grain size, separating the "fines", etc. and redistributing them in the different baskets provided for them. The repetition of more than 10 successive cycles without the removal of the thin sheets serving as the "source", consisting of a Fe-Al alloy with 16% Al, changing only the pieces to be coated, made it possible to verify, on the one hand, the simplicity of the process, and on the other, the repetitive and reproducible nature of the result obtained by comparing the gains in weight obtained.

EXAMPLE 4

The great flexibility of the process and various possibilities were demonstrated by changing the nature of the element to be deposited. In order to obtain principally a certain protection against the so-called "sulfurizing" corrosion, a chromium deposit was effected. For this purpose, a thin foil of a high chromium alloy, containing 50% Cr and 50% Ni, was used, arranged as before around the bar to be coated, in a conventional treatment enclosure, in the presence of a halide salt, in this case ammonium chloride, and the charge assembled in this manner exposed to a treatment of 3 h at 1 100° C., in a furnace with an argon atmosphere.

After removal from the furnace the specimen had a uniform white metallic color, showing in a micrographic section, the presence of a regular, superficial deposit, high in chromium and of a thickness of 30 to 35 μm.

The great flexibility of the process is thereby illustrated; it makes it possible simply by changing the nature of the source, to deposit chromium in place of aluminum.

EXAMPLE 5

In the same manner as in the preceding example, the nature of the source is again changed, this time by choosing a sheet of a commercial grade of titanium (designated T.40), and by varying the conditions of the heat treatment: approximately 6 h at 850° C. After removal from the furnace, the specimen has a uniform gray color and, after micrographic section, a layer of a thickness of 6 to 8 μm, perfectly joined with the base metal and high in titanium was present.

EXAMPLE 6

Following simple depositions, such as Al, or Cr or Ti, obtained simply by changing the nature of the metal or alloy constituting the source in the form of thin foils, without altering the rest of the apparatus, it has been possible that multiple depositions are feasible by the addition of single deposits. Thus, a first deposit was effected on a bar of the aforecited alloy IN 100, of Cr, followed by a second of Al. After removal from the furnace, the specimen had a whitish gray appearance. Micrographic examination shows a deposit with a total thickness of 70 μm, well joined with the base metal, capable of division into three zones of distinct appearance. Micrographs of the deposits obtained show the total absence of parasitic inclusions in the deposit, due to the use as sources of thin metal foil, while excluding all granular or powder products.

In addition to the successive deposition of chromium and aluminum, successive depositions of Cr and Ti, Ti and Al and even three successive depositions of Cr, Ti and Al, were accomplished.

This generalization of the process of the deposition in a single stage, in a halide vapor phase, of a metal from a source, to the deposition of complex layers in two or three stages, illustrates well the flexibility, the simplicity and the polyvalence of the process, providing protection against a great variety of agressive media, of the oxidation or sulfurizing type, by means of a minimum change in the material used.

What is claimed is:

1. A process for the vapor phase deposition of a protective metal coating of aluminum, chromium, titanium or their mixtures or alloys on a metal piece comprising the steps of: (a) placing the metal piece in a suitable enclosure; (b) placing a chemical halide compound in the enclosure; (c) placing a donor in the enclosure adjacent the area of the metal piece to be coated, the donor being in the form of a thin sheet of the metal coating material, the surface area of the sheet is of the same order of magnitude as the area of the metal piece to be coated facing the sheet; and (d) heating and subsequently cooling the metal piece, the chemical halide compound and the donor such that a halide compound with the coating material is formed, the halide compound decomposing when coming into contact with the surface of the metal piece to be coated thereby directly depositing a uniform coating of the coating material on the metal piece.

2. Process according to claim 1 wherein said donor sheet is placed in the enclosure, in the form of concentric cylinders, between which the metal piece or pieces to be coated are placed.

3. Process according to claim 1 wherein said donor sheet is formed so as to entirely surround the metal piece or pieces to be coated.

4. Process according to claim 1 wherein said thin donor sheet is introduced inside the metal piece, to effect the coating of the interior surface of said metal piece.

* * * * *

UNITED STATES PATENT AND TRADEMARK OFFICE
CERTIFICATE OF CORRECTION

PATENT NO. : 4,427,720
DATED : January 24, 1984
INVENTOR(S) : Georges M. C. A. GAUJE It is certified that error appears in the above-identified patent and that said Letters Patent is hereby corrected as shown below:

Column 4, line 10, change "moss" to read -- mass --.

Signed and Sealed this

Tenth Day of April 1984

[SEAL]

Attest:

GERALD J. MOSSINGHOFF

Attesting Officer    Commissioner of Patents and Trademarks